United States Patent
Monreal et al.

(10) Patent No.: US 10,527,703 B2
(45) Date of Patent: Jan. 7, 2020

(54) CIRCUITS AND TECHNIQUES FOR PERFORMING SELF-TEST DIAGNOSTICS IN A MAGNETIC FIELD SENSOR

(71) Applicant: Allegro MicroSystems, LLC, Manchester, NH (US)

(72) Inventors: Gerardo A. Monreal, Buenos Aires (AR); Bruno Luis Uberti, Ciudad de Buenos Aires (AR); Alejandro G. Milesi, Buenos Aires (AR); Joseph D. Hollins, Salem, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 14/970,949

(22) Filed: Dec. 16, 2015

(65) Prior Publication Data
US 2017/0176566 A1    Jun. 22, 2017

(51) Int. Cl.
*G01R 35/00*    (2006.01)
*G01R 33/07*    (2006.01)
*G01R 33/00*    (2006.01)

(52) U.S. Cl.
CPC ....... *G01R 35/005* (2013.01); *G01R 33/0035* (2013.01); *G01R 33/075* (2013.01)

(58) Field of Classification Search
CPC .......................... G01R 33/075; G01R 35/005; G01R 33/0035; G01R 35/00; G01R 33/0023;
(Continued)

(56) References Cited

U.S. PATENT DOCUMENTS

| 4,004,217 A | 1/1977 | Giffard |
| 4,465,976 A | 8/1984 | Avery et al. |

(Continued)

FOREIGN PATENT DOCUMENTS

| EP | 1032846 A1 | 9/2000 |
| JP | S 63-185555 A | 8/1988 |

(Continued)

OTHER PUBLICATIONS

U.S. Non-Final Office Action dated Apr. 21, 2017 for U.S. Appl. No. 14/578,800; 17 Pages.
(Continued)

*Primary Examiner* — Paresh Patel
*Assistant Examiner* — Brent J Andrews
(74) *Attorney, Agent, or Firm* — Daly, Crowley, Mofford & Durkee, LLP

(57) ABSTRACT

Systems and methods are provided herein for performing a self-test of a magnetic field sensor using internal diagnostic components for fault detection. The magnetic field sensor includes a magnetic sensing element coupled to a sensor biasing current source and a switching network coupled to the magnetic sensing element. The switching network includes one or more diagnostics switches and one or more signal switches, and the one or more diagnostic switches are coupled to a diagnostic input current source. The switching network is configured to generate a time-multiplexed signal having a magnetic signal responsive to an external magnetic field in a magnetic signal time period and a diagnostic signal in a diagnostic signal time period. The diagnostic signal may be operable to produce an intermediate signal to have a predetermined sequence between a first state and a second state.

40 Claims, 6 Drawing Sheets

(58) Field of Classification Search
CPC .... G01R 33/00; G01R 33/072; G01R 15/202; G01R 31/2829; G01R 33/091; G06F 19/00; H03K 5/003
See application file for complete search history.

(56) References Cited

U.S. PATENT DOCUMENTS

| | | | |
|---|---|---|---|
| 4,764,760 | A | 8/1988 | Bedard et al. |
| 5,499,526 | A | 3/1996 | Muro |
| 5,612,488 | A | 3/1997 | Yamamoto et al. |
| 5,631,602 | A | 5/1997 | Kearney et al. |
| 5,793,778 | A | 8/1998 | Qureshi |
| 6,191,698 | B1 | 2/2001 | Hennig et al. |
| 6,420,868 | B1 | 7/2002 | Ganther, Jr. et al. |
| 6,545,495 | B2 | 4/2003 | Warmack et al. |
| 6,980,005 | B2 | 12/2005 | Finlay, Sr. et al. |
| 7,096,386 | B2 | 8/2006 | Ozawa |
| 7,271,595 | B2 | 9/2007 | Shimizu et al. |
| 7,327,153 | B2 | 2/2008 | Weinraub |
| 7,694,200 | B2 | 4/2010 | Forrest et al. |
| 7,800,389 | B2 | 9/2010 | Friedrich et al. |
| 7,923,996 | B2 | 4/2011 | Doogue et al. |
| 8,030,918 | B2 | 10/2011 | Doogue et al. |
| 8,258,795 | B2 | 9/2012 | Fink et al. |
| 8,477,556 | B2 | 5/2013 | Friedrich et al. |
| 8,542,010 | B2 | 9/2013 | Cesaretti et al. |
| 8,680,846 | B2 | 3/2014 | Cesaretti et al. |
| 8,692,546 | B2 | 4/2014 | Cesaretti et al. |
| 8,890,518 | B2 | 11/2014 | Daubert |
| 9,201,122 | B2 | 12/2015 | Cesaretti et al. |
| 9,228,860 | B2 | 1/2016 | Sharma et al. |
| 9,291,666 | B2 | 3/2016 | Ueno et al. |
| 2002/0021126 | A1 | 2/2002 | Ishibashi et al. |
| 2003/0164711 | A1 | 9/2003 | Ishida |
| 2004/0059959 | A1 | 3/2004 | Ozawa |
| 2004/0193988 | A1 | 9/2004 | Saloio |
| 2005/0038623 | A1 | 2/2005 | Hammerschmidt |
| 2006/0066296 | A1 | 3/2006 | Kuroyanagi et al. |
| 2007/0096759 | A1 | 5/2007 | Weinraub |
| 2008/0013298 | A1 | 1/2008 | Sharma et al. |
| 2008/0297181 | A1 | 12/2008 | Ausserlechner |
| 2009/0019330 | A1 | 1/2009 | Friedrich et al. |
| 2010/0026281 | A1* | 2/2010 | Nishikawa ............ G01D 5/2448 324/207.13 |
| 2010/0211347 | A1* | 8/2010 | Friedrich ............ G01R 33/0023 702/117 |
| 2010/0237890 | A1 | 9/2010 | Motz et al. |
| 2010/0308886 | A1* | 12/2010 | Ogawa ................. G01R 33/072 327/307 |
| 2011/0018533 | A1 | 1/2011 | Cesaretti et al. |
| 2011/0234813 | A1 | 9/2011 | Baecher et al. |
| 2012/0165649 | A1* | 6/2012 | Gleich ............... A61B 5/02007 600/409 |
| 2013/0214774 | A1 | 8/2013 | Cesaretti et al. |
| 2013/0300406 | A1 | 11/2013 | Pepka et al. |
| 2014/0159756 | A1* | 6/2014 | Ueno ................... G01R 15/202 324/750.01 |
| 2014/0266181 | A1 | 9/2014 | Milano et al. |
| 2015/0185284 | A1 | 7/2015 | Milano et al. |
| 2015/0185293 | A1* | 7/2015 | Milano ................. G01R 33/09 324/251 |
| 2015/0276892 | A1 | 10/2015 | Butenhoff et al. |
| 2015/0301149 | A1 | 10/2015 | Cesaretti et al. |

FOREIGN PATENT DOCUMENTS

| | | |
|---|---|---|
| JP | 02-271256 | 11/1990 |
| JP | H 03-96809 A | 4/1991 |
| JP | 05-014196 | 1/1993 |
| JP | H 06-26968 A | 2/1994 |
| JP | H 06-300584 A | 10/1994 |
| JP | 07-066649 | 3/1995 |
| JP | 09-079004 | 3/1997 |
| JP | H 10-504436 A | 4/1998 |
| JP | 2003-195933 | 7/2003 |
| JP | 2006-98140 | 4/2006 |
| JP | 2006105932 A | 4/2006 |
| JP | 2010071729 A | 4/2010 |
| JP | 2012247341 A | 12/2012 |
| WO | WO 96/41415 | 12/1996 |
| WO | WO 2006/056829 A1 | 6/2006 |
| WO | WO 2012/164915 A2 | 12/2012 |

OTHER PUBLICATIONS

Response to U.S. Non-Final Office Action dated Dec. 2, 2016 for U.S. Appl. No. 14/578,789, filed Mar. 21, 2017; 20 Pages.
PCT International Search Report and Written Opinion dated Mar. 2, 2017 for PCT/US2016/064300; 15 Pages.
U.S. Appl. No. 14/812,313, filed Jul. 29, 2015, Cesaretti et al.
U.S. Appl. No. 11/779,354.
Japanese Notice of Reasons for Rejection dated Aug. 29, 2012; for Japanese Pat. App. No. 2010-517046; 3 pages.
Letter to Yuasa and Hara dated Oct. 29, 2012; for Japanese Pat. App. No. 2010-517046; 4 pages.
Japanese Argument and Amendment dated Nov. 28, 2012; for Japanese Pat. App. No. 2010-517046; 7 pages.
Japanese Claims as Filed English Translation dated Nov. 28, 2012; for Japanese Pat. App. No. 2010-517046; 6 pages.
Japanese Notice of Reasons for Rejection dated Sep. 9, 2013; for Japanese Pat. App. No. 2013-088148; 2 pages.
PCT Invitation to Pay Additional Fees dated Jun. 10, 2015; for PCT Pat. App. No. PCT/US2014/071825; 6 pages.
PCT International Search Report and Written Opinion of the ISA dated Oct. 8, 2015; for PCT Pat. App. No. PCT/US2014/071825; 19 pages.
PCT International Search Report and Written Opinion of the ISA dated Sep. 19, 2008; for PCT Pat. App. No. PCT/US2008/067060; 15 pages.
"Chopper-Stabilized Precision Hall-Effect Switch with Advanced Diagnostics;" Allegro Microsystems, A1160, Sep. 21, 2015; pp. 1-13 (13 pages).
Extended European Search Report dated Jul. 7, 2017 for European Application No. 17158005.3-1568; 5 Pages.
U.S. Final Office Action dated Jun. 30, 2017 for U.S. Appl. No. 14/578,789; 26 Pages.
Response to U.S. Non-Final Office Action dated Apr. 21, 2017 for U.S. Appl. No. 14/578,800, filed Jul. 21, 2017; 12 Pages.
European Response with Amended Claims and Specifications to European Office Action dated Jul. 29, 2016 for European Application No. 14825561.5; Response filed on Feb. 7, 2017; 12 Pages.
Request for Continued Examination from U.S. Appl. No. 14/578,789, filed Oct. 2, 2017; 3 Pages.
Response to Final Office Action dated Jun. 30, 2017 from U.S. Appl. No. 14/578,789, filed Oct. 2, 2017; 13 Pages.
Final Office Action dated Nov. 2, 2017 from U.S. Appl. No. 14/578,800; 26 Pages.
Response to Non-Final Office Action dated Jan. 18, 2018 for U.S. Appl. No. 14/578,789, filed Apr. 18, 2018; 15 Pages.
Response to U.S. Final Office Action dated Nov. 2, 2017 for U.S. Appl. No. 14/578,800, filed Mar. 14, 2018; 8 pages.
U.S. Non-Final Office Action dated Jan. 18, 2018 corresponding to U.S. Appl. No. 14/578,789; 20 Pages.
Japanese Voluntary Amendment (with English Claims) filed Dec. 20, 2017 corresponding to Japanese Appl. No. 2016-543184; 12 Pages.
PCT International Preliminary Report on Patentability dated Jun. 28, 2018 for International Application No. PCT/US2016/064300; 12 pages.
Response to Official Communication dated Aug. 14, 2017 for European Application No. EP 14158005.3; Response Filed May 3, 2018; 13 Pages.
U.S. Non-Final Office Action dated Jun. 1, 2018 for U.S. Appl. No. 14/578,800; 16 Pages.
U.S. Notice of Allowance dated Jul. 9, 2018 for U.S. Appl. No. 14/578,789; 9 Pages.

(56) References Cited

OTHER PUBLICATIONS

Office Action dated Nov. 26, 2018 for Japanese Application No. 2016-543184 with English Translation; 6 Pages.
Response to Office Action dated Jun. 19, 2018 for European Application No. 16816799.7 as filed on Dec. 21, 2018; 21 Pages.
Final Office Action dated Nov. 19, 2018 for U.S. Appl. No. 14/578,800; 18 Pages.
Communication pursuant to Rules 161(1) and 162 EPC dated Jun. 19, 2018 for European Application No. 16816799.7; 3 Pages.
Response to Non-Final Office Action dated Jun. 1, 2018 for U.S. Appl. No. 14/578,800, filed Aug. 23, 2018; 10 Pages.
U.S. Notice of Allowance dated Oct. 9, 2019 for U.S. Appl. No. 14/578,800; 10 Pages.
European Intention of Grant dated Mar. 14, 2019 for European Application No. 16816799.7; 7 pages.
European Decision of Grant dated May 3, 2019for European Application No. 16816799.7; 2 pages.
Office Action dated Dec. 2, 2016 from U.S. Appl. No. 14/578,789; 23 Pages.
Response to U.S. Final Office Action dated Nov. 19, 2018 for U.S. Appl. No. 14/578,800, filed Feb. 14, 2019; 10 Pages.
Response (with English Translation and Amended Claims) to Japanese Office Action dated Nov. 26, 2018 for Japanese Application No. 2016-543184; Response filed Feb. 18, 2019; 14 Pages.
Japanese Notice of Allowance (with English Reporting Letter and Allowed Claims) dated Feb. 26, 2019 for Japanese Application No. 2016-543184; 9 Pages.

* cited by examiner

CIRCUITS AND TECHNIQUES FOR PERFORMING SELF-TEST DIAGNOSTICS IN A MAGNETIC FIELD SENSOR

FIELD OF THE INVENTION

This invention relates generally to magnetic field sensors and, more particularly, to magnetic field sensors internally performing self-test diagnostics.

BACKGROUND

As is known, there are a variety of types of magnetic field sensing elements, including, but not limited to, Hall effect elements, magnetoresistance elements, and magnetotransistors. As is also known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Magnetic switches are used as examples herein. However, the circuits and techniques described herein apply also to any magnetic field sensor.

To perform diagnostics, magnetic field sensors may be coupled to an externally enabled diagnostic function. The externally enabled diagnostic function design may require the magnetic field sensor to stop running its primary functions in order to perform the diagnostics. Thus, it would be desirable to perform diagnostics without the need for external diagnostic functions or requests.

SUMMARY

The present disclosure is directed to systems and methods for performing a self-test of a magnetic field sensor using internal diagnostic components for fault detection. The magnetic field sensor can perform self-test diagnostics in the background of selected ones (e.g., every other one), of a plurality of signal time periods whereby a magnetic signal occurring during magnetic signal time periods and a diagnostic signal occurring during diagnostic signal time periods occur as a time-multiplexed signal in a time-multiplexed arrangement. Thus, the diagnostics may be performed in a background protocol while the magnetic field sensor is still running its main function (i.e., to sense an external magnetic field). Both, the magnetic signal and diagnostic signal may be applied to a signal path of the magnetic field sensor, upon which the time-multiplexed signal can be carried, wherein the time-multiplexed signal transitions between the magnetic signal and diagnostic signal such that the diagnostics may be constantly running in selected ones of the plurality of signal time periods (e.g., in every other signal time period). In some embodiments, during a diagnostic signal time period, the magnetic signal may be canceled or stopped.

In accordance with one aspect of the present disclosure, a magnetic field sensor configured to internally perform self-diagnostic testing. The magnetic field sensor includes a magnetic sensing element coupled to a sensor biasing current source and a switching network coupled to the magnetic sensing element. The switching network includes one or more diagnostics switches and one or more signal switches, and the one or more diagnostic switches are coupled to a diagnostic signal source. In an embodiment, the magnetic field sensing element is configured to generate a time-multiplexed signal comprising a magnetic signal responsive to an external magnetic field in a magnetic signal time period and a diagnostic signal responsive to the diagnostic signal source in a diagnostic signal time period. The diagnostic signal may be operable to force an intermediate signal to produce a predetermined sequence between a first state and a second state in an output signal in a normal mode of operation.

In an embodiment, the magnetic field sensing element is configured to generate the time-multiplexed signal such that the time-multiplexed signal alternates between the magnetic signal and the diagnostic signal in one sampling cycle. In some embodiments, the diagnostic signal may be generated first and the magnetic signal is generated second in the time-multiplexed signal. In other embodiments, the magnetic signal is generated first and the diagnostic signal is generated second in the time-multiplexed signal. The magnetic field sensing element may be coupled to the one or more signal switches of the switching network and the time-multiplexed signal may be provided to the one or more signal switches. In some embodiments, the switching network is configured to receive the sensor biasing current source and the diagnostic signal source simultaneously.

The magnetic field sensor may further include a comparator coupled to the switching network, whereby the comparator is configured to receive the time-multiplexed signal and output an output signal in the first state or the second state responsive to the magnetic signal and the diagnostic signal.

The magnetic field sensor may include a fault monitoring module having a diagnostic signal monitor, a resistance monitor, a logic monitor, and a memory monitor. The diagnostic signal monitor may be configured to compare a reference diagnostic signal to the diagnostic signal in the diagnostic signal time period to verify a quality of the diagnostic signal source. The magnetic field sensing element further comprises a resistance element, and wherein the resistance monitor is configured to compare a resistance value of the resistance element to a predetermined range of values. The logic monitor may be configured to monitor an output of a clock logic module, the clock logic module configured to generate logic signals for the switching network. The memory monitor may be configured to monitor a memory value for the magnetic field sensor.

In some embodiments, the magnetic field sensor includes a processing unit coupled to the fault detection module. The processing unit may be configured to transition the magnetic field sensor between each of a normal mode, a fault mode, and a recovery mode. In an embodiment, the processing unit is configured to transition the magnetic field sensor to FAULT mode in response to a fault detection. The processing unit may be configured to transition the magnetic field sensor to recovery mode in response to a fault detection. The processing circuit may be configured to receive a fault detection from each of the diagnostic signal monitor, the resistance monitor, the logic monitor, and the memory monitor.

In some embodiments, the diagnostic signal source is configured to provide a recovery sequence signal to the switching network during recovery mode. The processing unit may be configured to transition the magnetic field sensor to normal mode in response to a pass detection, the pass detection received responsive to the recovery sequence signal.

In accordance with one aspect of the present disclosure, a method for internally performing self-diagnostic testing for a magnetic field sensor is provided. The method includes providing a sensor biasing current source to a magnetic sensing element and providing a diagnostic signal source to a switching network. The switching network may include one or more diagnostics switches and one or more signal switches. The method further includes generating a time-multiplexed signal having a magnetic signal responsive to an external magnetic field in a magnetic signal time period and a diagnostic signal responsive to the diagnostic signal source in a diagnostic signal time period. In an embodiment, the time-multiplexed signal is generated by the switching network. The method further includes forcing, by the diagnostic signal, an intermediate signal to produce a predetermine sequence of two-state transitions between a first state and a second state.

In some embodiments, the time-multiplexed signal is generated such that the time-multiplexed signal alternates between the magnetic signal and the diagnostic signal in one sampling cycle. In the time-multiplexed signal, the diagnostic signal may be generated first and the magnetic signal may be generated second. In some embodiments, the time-multiplexed signal is provided to the one or more signal switches of the switching network.

In an embodiment, the method includes receiving, by the switching network, the sensor biasing current source and the diagnostic input current source simultaneously. A comparator coupled to the switching network, may generate an output signal in the first state or the second state responsive to the magnetic signal and the diagnostic signal of the time-multiplexed signal.

In an embodiment, a diagnostic signal monitor may compare a reference diagnostic signal to the diagnostic signal in the diagnostic signal time period to verify a quality of the diagnostic input current source. A resistance monitor may compare a resistance value of a resistance element of the magnetic field sensing element to a predetermined range of values. A logic monitor may monitor an output of a clock logic module the clock logic module configured to generate logic signals for the switching network. A memory monitor may monitor a memory value for the magnetic field sensor.

A processing circuit may be coupled to each of the diagnostic signal monitor, the resistance monitor, the logic monitor, and the memory monitor and be configured to receive a fault indication from each of them. In some embodiments, the processing unit transitions the magnetic field sensor between each of a normal mode, a fault mode, and a recovery mode. For example, the method may include transitioning the magnetic field sensor to fault mode in response to a fault detection. Furthermore, the magnetic field sensor may transition to recovery mode in response to a fault detection, whereby an input voltage to the magnetic sensing element is modified to a predetermined level.

In some embodiments, the method includes generating a recovery sequence signal to test the magnetic field sensor, providing the recovery signal sequence to the switching network, and detecting a response of the magnetic field sensor to the recovery signal sequence. In some embodiments, the processing circuit may receive the response of the magnetic field sensor to the recovery signal sequence, determine that the magnetic field sensor passed a diagnostic test responsive to the recovery signal sequence, and generate an internal reset signal. The magnetic field sensor may transition to normal mode in response to the internal reset signal.

BRIEF DESCRIPTION OF THE DRAWINGS

The foregoing features may be more fully understood from the following description of the drawings in which.

DETAILED DESCRIPTION

Figure 1:
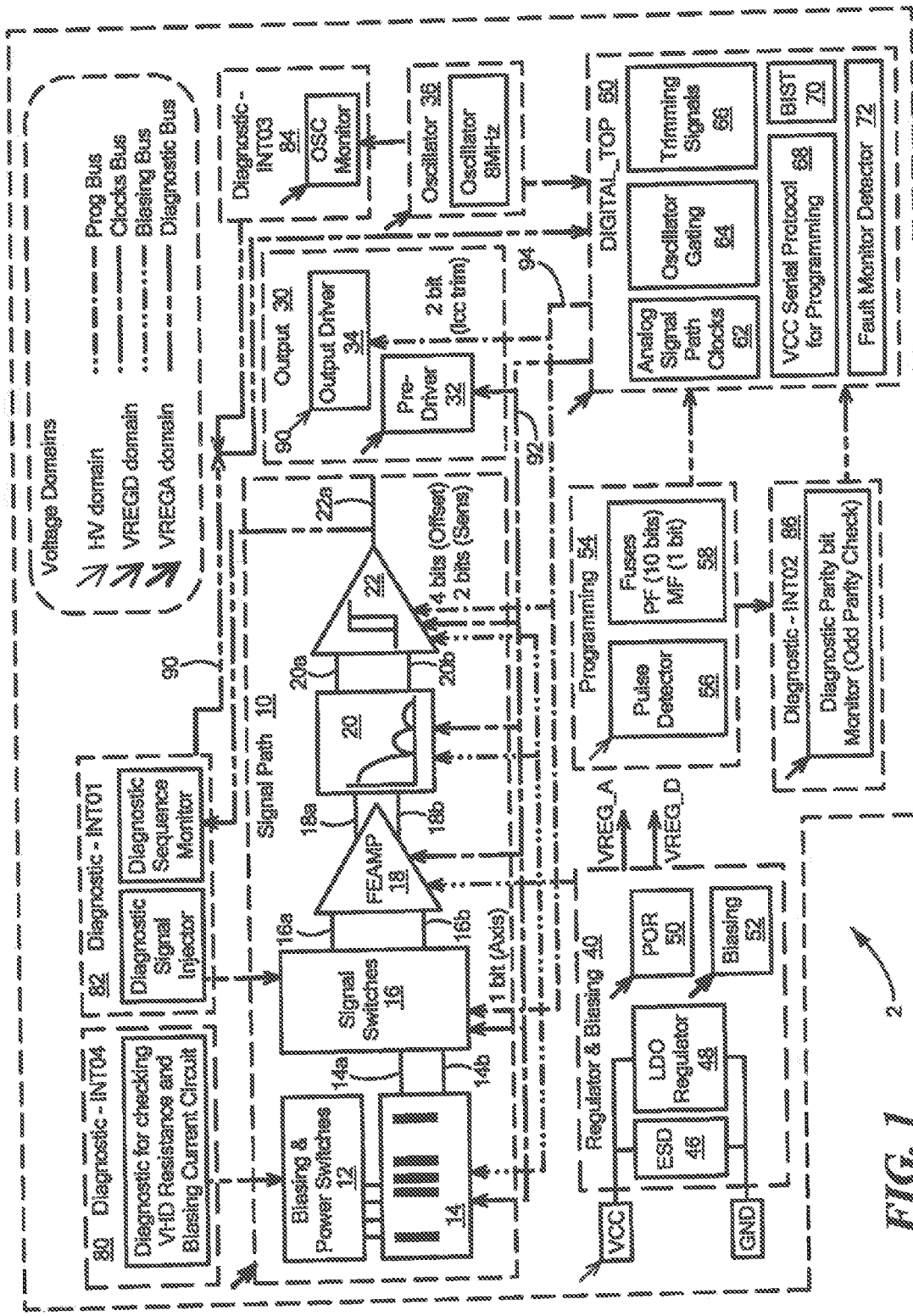
FIG. 1 is a block diagram of an example of a magnetic field sensor configured to internally perform self-diagnostic testing.

Before describing the present invention, some introductory concepts and terminology are explained.

As used herein, the term "magnetic signal" is used to describe an electronic signal responsive to an external magnetic field.

As used herein, the term "magnetic signal time period" is used to describe a time period, which may a plurality of time periods, during which the magnetic signal is present.

As used herein, the term "diagnostic signal" is used to describe an electronic signal responsive to an electronic diagnostic signal, and not responsive to the magnetic signal.

As used herein, the term "diagnostic signal time period" is used to describe" is used to describe a time period, which may a plurality of time periods, during which the magnetic signal is present.

While differential signals are shown and described herein, it should be recognized that similar circuits can use single ended signals.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level. However the comparator can also be comprised of a digital circuit having an output signal with at least two states indicative of an input signal being above or below a threshold level.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While a vertical Hall element is shown in examples below, it will be appreciated that similar circuits and techniques can apply to any type of Hall effect element, including, but not limited to a planar Hall effect element.

The present disclosure is directed to systems and methods for performing self-diagnostics using internal diagnostic components. A magnetic field sensor is provided that is configured to perform the self-test diagnostics in the background, such that magnetic signals occur during magnetic signal time periods and diagnostic signals occur during diagnostic signal time periods, wherein the diagnostic signals occur periodically and automatically. In an embodiment, due to the time-multiplexed arrangement, the magnetic field sensor can at the same time perform diagnostics and also run its main functions for sensing a magnetic field.

As described above, the time-multiplexed signal may be generated that transitions back and forth between magnetic signals and diagnostics signals. In some embodiments, the time-multiplexed signal is generated such that initially the magnetic signal is run first. Alternatively, applications may require diagnostics to be run in the initial moments of a power-up phase (e.g., integrated circuit power-up), before a first magnetic signal time period is run. Thus, the magnetic field sensors as described herein may run an installment of diagnostics prior to the first magnetic signal time period. The circuitry and components configured to perform the internal diagnostics may be self-contained within the magnetic field sensor. The diagnostic signal may be electrical so that the magnetic field sensor is not affected by an external magnetic field during the diagnostic time period.

In some embodiments, such as for application that may require continuous output from the magnetic signal, a secondary signal path is made available so that when one signal path is communicating diagnostics, the other signal path operates normally (i.e., communicating the magnetic signal). Furthermore this process may be reversed to allow for proper diagnosing of the second path.

Now referring to FIG. 1, an illustrative block diagram of magnetic field sensor 2 includes a signal path 10, which includes a plurality of circuit elements described below. The magnetic field sensor 2 can include four diagnostics modules: a resistance and biasing diagnostic module 80, the signal diagnostic module 82, an oscillator diagnostic module 84, and memory diagnostic module 86. Furthermore, magnetic field sensor 2 may include various control and input modules, such as oscillator 36, regulator and biasing module 40, programming module 54, and digital module 60 that are discussed in greater detail below.

Signal path 10 can include biasing and power switches circuit 12 coupled to a vertical Hall element 14. The vertical Hall element 14 is configured to generate an output signal 14a, 14b that is passed to switching circuit 16. Switching circuit 16 can be coupled to receive the signal 14a, 14b and configured to generate a chopped signal 16a, 16b. The switching circuit 16 can also be switched with the clock at a frequency of fc.

Together, the biasing and switching circuit 12 and the signal switches circuit 16 can result in current spinning of the vertical Hall element 14, thus resulting in the chopped signal 16a, 16b. Current spinning is a known technique and is not further described herein.

An amplifier 18 can be coupled to receive the chopped signal 16a, 16b and configured to generate an amplified signal 18a, 18b. A filter 20 can be coupled to receive amplified signal 18a, 18b and configured to generate a filtered signal 20a, 20b. In some embodiments, filter 20 is a sin x/x (sin c) filter. For example, filter 20 may be a switched capacitor filter having a first notch at a frequency fc. However, in other embodiments, the sin c filter 22 is generated digitally. In still other embodiments, the sin c filter 22 is an analog un-clocked filter. In some embodiments, filter 22 is a low pass filter. In one embodiment, filter 20 includes both a low-pass filter and a sin x/x (sin c) filter, whereby the low-pass filter generates a filtered signal and provides the filtered signal to the sin x/x (sin c) filter.

A comparator 22 can be coupled to receive the filtered signal 20a, 20b and configured to generate a comparison signal 22a. In some embodiments, comparator 22 is a Schmitt trigger. Comparator 22 may be configured to receive the filtered signal 20a, 20b and output the comparison signal 22a in magnetic signal time periods responsive to the magnetic signal and in diagnostic signal time periods responsive to the diagnostic signal in a time-multiplexed arrangement. In an embodiment, during the diagnostic signal time periods, diagnostics may be performed on the comparison signal 22a to test for faults or other issues with the magnetic field sensor 2.

For example, the four diagnostic modules, resistance and biasing diagnostic module 80, a signal diagnostic module 82, an oscillator module 84, and a memory diagnostic module 86 are configured to perform self-test diagnostics on various components of magnetic field sensor 2. The four diagnostic modules 80, 82, 84, 86 may be part of a single fault monitoring module or may be individual separate modules.

Signal diagnostic module 82 is coupled to the signal path 10 and the signal diagnostic module 82 is configured to receive the comparison signal 22a. In some embodiments, signal diagnostics module 82 is configured to compare the comparison signal 22a that occurs during one or more of the above described diagnostic signal time periods with a reference (i.e., predetermined) diagnostic signal, i.e. a replica of a diagnostic signal, to identify a passing or failing condition. The reference diagnostic signal may have a predetermined sequence that can be compared with comparison signal 22a to detect a fault condition. The predetermined sequence may be based upon a desired number of transitions in an output signal. For example, the reference diagnostic signal may include a predetermined number of transitions (e.g., two or more transitions) that can be compared with a number of (or lack of) transitions in comparison signal 22a to detect a fault condition. In other embodiments, a fault may be detected based on whether a position of a transition in an output signal is within a predetermined percentage error range of a correct position or whether a transition occurs within a predetermined time period (e.g., transitions occur within an acceptable time period). An example of a diagnostic signal is described below in conjunction with FIG. 3.

Resistance and biasing diagnostic module 80 can be coupled to biasing and power switches circuit 12 as discussed in greater detail below with respect to FIG. 2. The resistance and biasing diagnostic module 80 may be configured to compare a resistance value of the vertical Hall element 14 to a predetermined range of resistance values to detect a fault condition or verify that the vertical Hall effect element 14 has a resistance within the predetermined range of resistance values. In some embodiments, resistance and biasing diagnostic module 80 compare a resistance value of the vertical Hall element 14 to an initial set of resistance values to detect a parametric shift. The predetermined range of resistance values may include one or more threshold levels such that each threshold level indicates a different level of quality (e.g., level of degradation) of the particular component. For example, a first threshold level may indicate damage to a component, however the component still operates in an acceptable range. While a second threshold level may indicate a complete failure of a component.

Oscillator diagnostic module 84 can be coupled to oscillator 36 and to a diagnostic bus 90. In an embodiment, oscillator diagnostic module 84 is configured to receive an electronic signal produced by oscillator 36 and to verify a quality, e.g., a frequency and/or an amplitude, of the electronic signal produced by oscillator 36. Accordingly, the oscillator diagnostic module 84 can identify a pass or fail condition associated with the oscillator 36 and can communicate the pass or fail condition upon the diagnostic bus 90.

In some embodiments, the oscillator 36 can be coupled to a clock logic digital module 60 configured to generate logic signals and clock signals upon a clocks bus 92, for switching networks and switching circuits of magnetic field sensor 2.

In an embodiment, memory diagnostic module 86 can configured to perform a diagnostics to test memory storage capabilities of components of the magnetic field sensor 2. In some embodiments, memory diagnostics module 86 performs a parity bit check to test memory storage devices of the magnetic field sensor 2. In some embodiments, memory diagnostic module 86 can be configured to monitor a memory value for the magnetic field sensor 2.

Output circuit 30 can be coupled to the diagnostic bus 90 and can be configured to receive, via the diagnostic bus 90 pass and fail conditions determined by each one of the four diagnostic modules, namely, resistance and biasing diagnostic module 80, signal diagnostic module 82, oscillator diagnostic module 84, and memory diagnostic module 86. Output circuit 30 includes a pre-driver 32 and an output driver 34. In some embodiments, the clocks bus 92 provides control signals to control the vertical Hall element 14, the signal switches 16, the amplifier 18, the sin c filter 20, the comparator 22, the pre-driver circuit 32, and the output driver circuit 34. In some embodiments, the output driver circuit 34 generates a current output signal represented, for example, in FIG. 4.

Memory diagnostic module 86 can be coupled to a programming module 54. In operation, the programming module 54 can receive an external signal to program fuses 58 within the programming module 54. Once programmed, the fuses 58 can control a variety of operations of the magnetic field sensor 2. In an embodiment, programming module 54 is coupled to digital module 60 and configured to program and control operation of the components of digital module 60. Programming module 54 can be coupled to memory diagnostic module 86. Memory diagnostics module 86 can be configured to verify a memory status of digital module 60. Various parameters identified in the programmed fuses 58 can be passed to the digital module 60 and communicated via a programming bus 94 throughout the magnetic field sensor 2.

Regulator and biasing module 40 can include ESD 46, LDO regulator 48, POR) circuit 50, and biasing circuit 52. Regulator and biasing module 40 may be coupled to receive a voltage (VCC) and ground. ESD 46 may be an electrostatic discharge protection circuit. LDO regulator 48 may be a low-dropout regulator and can be configured to regulate an output voltage. POR circuit 50 may be a power-on reset circuit that is configured to a detect various voltage and currents levels in the magnetic field sensor 2 and generate a reset pulse to reset various circuits within the magnetic field sensor 2 when a power on condition is detected. Biasing circuit 50 may be configured to generate predetermined voltages or currents at various points of the magnetic field sensor 2 on a biasing bus 96. In some embodiments, biasing circuit 50 is used to establish proper operating conditions.

Digital module 60 can include analog signal path clocks 62, oscillator gating 64, trimming signals 66, source voltage (VCC) serial protocol for programming 68, BIST 70, and fault detection monitor 72. BIST 70 may be a built-in self-test circuit and configured to perform a self-test for components of signal path 10 and/or in the digital module 60. In some embodiments, digital module 60 may be referred to as a processing circuit. Digital module 60 may be coupled to each of diagnostic modules (resistance and biasing diagnostic module 80, signal diagnostic module 82, oscillator diagnostic module 84, and memory diagnostic module 86) via the diagnostic bus 90. Diagnostic module 60 may be configured to receive an indication (e.g., flag) of a fault condition within magnetic field sensor 2 from each of the diagnostic modules.

Digital module 60 may be coupled to output driver circuit 34 via diagnostic bus 90. In response to a fault detection, digital module 60 may generate and transmit a command signal to output driver circuit 34 via diagnostic bus 90. In an embodiment, digital module 60 is configured to command output driver circuit 34 to output a predetermined output (e.g., output signal) to indicate the fault condition within magnetic field sensor 2.

In some embodiments, fault detection monitor 72 receives each the indications (e.g., flags) of a fault condition within magnetic field sensor 2 from each of the diagnostic modules. Fault detection monitor 72 may be configured to detect and coordinate fault or passing conditions of each of the four self-test modules described above. Fault detection monitor 72 may be configured to generate and transmit a command signal to output driver circuit 34 via diagnostic bus 90 to indicate the fault condition within magnetic field sensor 2.

Oscillator 36 may be any general electronic circuit configured to produce a periodic, oscillating signal. In some embodiments, oscillator 36 converts a direct current (DC) signal to an alternating current (AC) signal. Oscillator 36 may be coupled to digital module 60.

Figure 2:
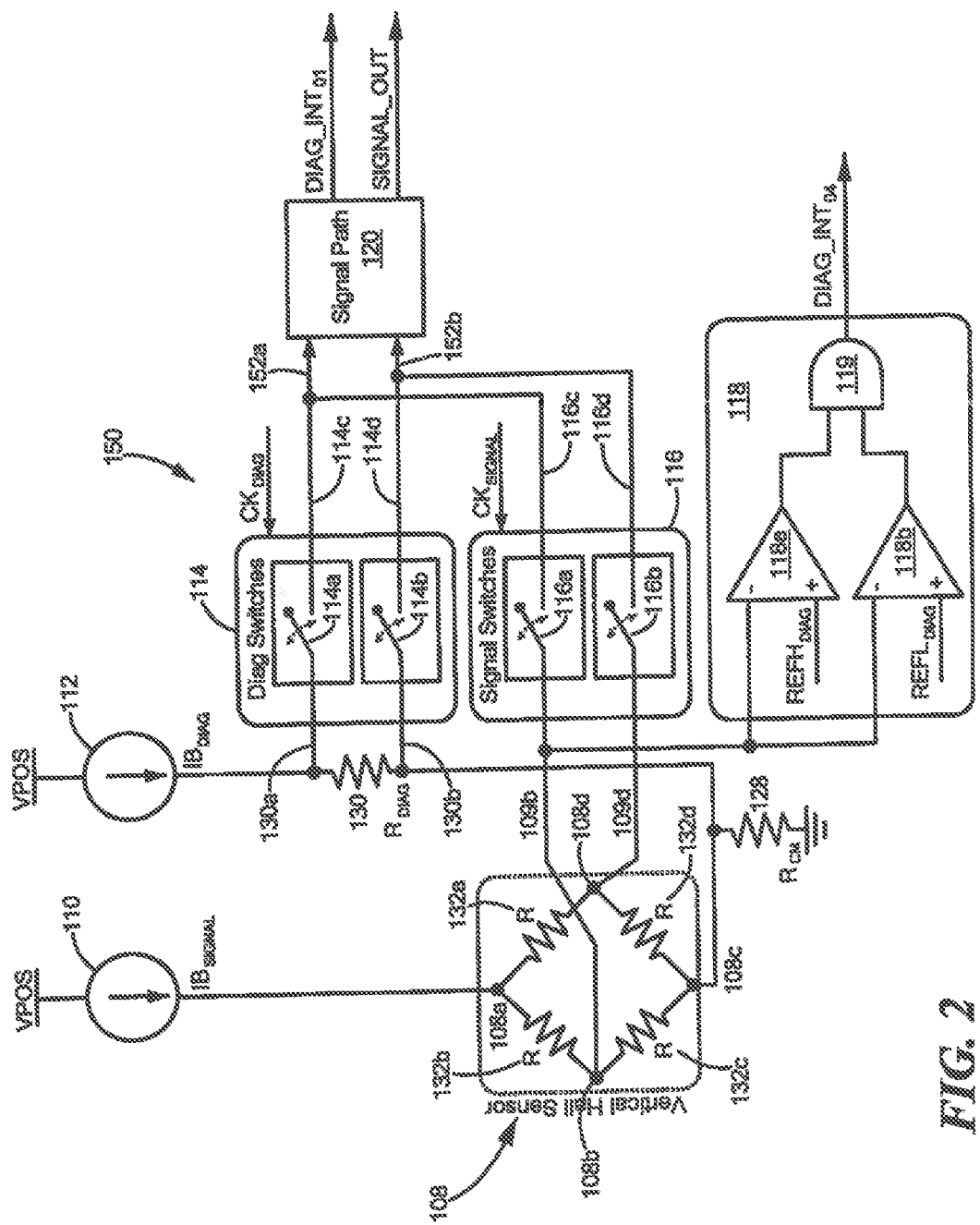
FIG. 2 is a block diagram of an example of a circuit for generating a time-multiplexed signal for a magnetic field sensor, such as magnetic field sensor of FIG. 1.

Now referring to FIG. 2, a circuit 150 can be the same as or similar to the vertical Hall element 14, the biasing and power switches circuit 12, the signal switches 16, a diagnostic signal injector circuit within the signal diagnostic module 82, and the resistance and biasing diagnostic module 80 of FIG. 1. However, the above described current spinning is not shown in FIG. 2, but will be understood.

A signal path 120 can be the same as or similar to the signal path 10 of FIG. 1.

The circuit 150 can include a signal current source (i.e., sensor biasing current source) 110 operable to drive a current into a vertical Hall element 108. In some embodiments, signal current source 110 continuously outputs a current into vertical Hall element 108. The vertical Hall element 108 can have five terminals, however, because two of the five terminals are conventionally coupled together, four effective terminals result, i.e., first, second, third, and fourth terminals, 108a, 108b, 108c, 108d, respectively, in a bridge arrangement. The signal current source 110 can drive the first terminal 108a and a differential output signal 109b, 109d (a magnetic signal) can result that is responsive to an external magnetic field.

Terminals 108b, 108d of the Hall effect element 108 can be coupled to switches 116a, 116b of signal switches 116. The signal switches 116 can generate a magnetic signal 116c, 116d. In an embodiment, signal current source 110 continuously outputs a current into vertical Hall element 108, however signal switches 116a, 116b may open to allow diagnostics to be performed on various components of magnetic field sensor 2.

The circuit 150 can also include a diagnostic current source (i.e., diagnostic input current source) 112 coupled to a first resistor 130. The first resistor 130 can be coupled at a junction node to a second resistor 128, which can terminate at a reference voltage, for example, ground. The junction node can be coupled to the terminal 108d of the vertical Hall element 108.

It will be appreciated that current from both the signal current source 110 and from the diagnostic current source 112 pass through the second resistor 128. Thus, a voltage sensed across the first resistor 130 can be, in-part, representative of a resistance thought the vertical Hall element 108.

The first resistor 130 can be coupled at a first end of the first resistor 130 to a switch 114a within diagnostic switches 114 and at a second end of the first resistor 130 to a switch 114b within the diagnostic switches 114. The diagnostic switches 114 can generate a diagnostic signal 114c, 114d. The diagnostic switches 114 and the signal switches 116 taken individually or together can be referred to herein as a switching network.

In an embodiment, the diagnostic signal 114c, 114d provided from the diagnostic switches 114 is responsive to the signal current source 110 and to the diagnostic current source 112, but is not responsive to an external magnetic field sensed by the vertical Hall element 108. Thus, the diagnostic signal 114c, 114d is essentially responsive to resistance of the vertical Hall element 108.

In an embodiments, the diagnostic switches 114 are closed when the signal switches 116 are open, and vice versa. Thus, a signal received by signal path 120 and generated by the signal path 120 is either is the diagnostic signal 114c, 114d at some times and the magnetic signal 116c, 116d responsive to an external magnetic field at other times.

Referring briefly to FIG. 1, the diagnostic module 80 and 82 can coordinate the opening and closing of diagnostic switches 114 and signal switches 116 in order to either apply a magnetic signal or a diagnostic signal to the signal path 10.

In operation, the diagnostic switches and the signal switches 114, 116, respectively, may be configured to generate a time-multiplexed signal 152a, 152b comprising the magnetic signal 116c, 116d responsive to an external magnetic field signal in some of a plurality of time periods and the diagnostic signal 114c, 114d responsive to the in others of the plurality of time periods. The diagnostic signal may have a predetermined transition pattern between a first state and a second state in a diagnostic mode of operation. Thus, diagnostics may constantly be running and circuit 150 may be configured to provide diagnostics in the background, for example, during every other time period of the plurality of time periods, such as a magnetic signal in a first time period and diagnostic signal in a second time period, which may be an adjacent time period to the first time period.

Diagnostic current source 112 can be coupled to first terminals of first and second diagnostic switches 114a, 114b. As described above, a diagnostic resistive element ($R_{diag}$) (first resistor) 130 may be coupled between the first terminal of first diagnostic switch 114a and the first terminal of second diagnostic switch 114b resulting in a diagnostic signal 114c, 114d generated by the diagnostic switches 114. In an embodiment, diagnostic current source 112 can be altered or transitioned between at least two different values to control operation (e.g., open or close) of the first terminal of first diagnostic switch 114a and the first terminal of second diagnostic switch 114b. For example, a control port (not shown) may be coupled to the diagnostic current source 112 and the control port can be configured to control and transition the output of the diagnostic current source 112 between different values. Thus, a current (e.g., diagnostic current source 112) through diagnostic resistive element (Rdiag) 130 may be altered to control operation of the first terminal of first diagnostic switch 114a and the first terminal of second diagnostic switch 114b (e.g., open or close switches). For example, to apply a diagnostic signal to signal Path 120, the current though diagnostic resistive element ($R_{diag}$) 130 may be altered to close diagnostic switches 114a, 114b. Alternatively, to end the application off the diagnostic signal to signal Path 120, the current though diagnostic resistive element ($R_{diag}$) 130 may be altered to open diagnostic switches 114a, 114b.

In an embodiment, diagnostic resistive element ($R_{diag}$) 130 has a resistance that results in a resulting electrical signal 20a, 20b value in the signal path 10 of FIG. 1 crossing one of an upper or a lower threshold of the comparator 22 when a resistance of the vertical Hall element 108 is proper. Thus, a test of the resistance of the vertical Hall element 108 can be performed.

In some embodiments, by changing positions of the first and second diagnostic switches 114a 114b (with other switches that are not shown), and opposite sign signal can be generated, wherein a resulting electrical signal 20a, 20b values in the signal path 10 of FIG. 1 crossing the other one of the upper or a lower threshold of the comparator 22 when a resistance of the vertical Hall element 108 is proper. The two coupling directions of the first and second diagnostic switches 114a, 114b results in an effective two state signal passing through the signal path 10 of FIG. 1. This two state signal is further described below in conjunction with FIG. 4. However, let is suffice here to say that the proper switching of the comparator 22, when using the diagnostic signal 114c, 114d switching is two different ways, switching at the correct times an in the correct sequence, can be indicative of the vertical Hall element 108 having a proper resistance, and also indicative of proper operation of the entire signal path 10 of FIG. 1.

In other embodiments, instead of changing positions of the first and second diagnostic switches to achieve a two-state signal, the diagnostic current source 112 can be an AC current source having two states.

Diagnostic current source 112 is coupled to ground through a common mode resistive element ($R_{cm}$) (second resistor) 128. In an embodiment, common mode resistive element (Rcm) 128 may be used to set the common mode voltage in the signal path 10 to a proper voltage. In some embodiments, a value of the common mode resistive element (Rcm) 128 is can be selected.

As described above, vertical Hall element 108 may be a vertical Hall element, which can include internal resistive elements. In some embodiments, for example as shown in FIG. 2, the vertical Hall element 108 can be represented as a Wheatstone bridge having four resistive elements 132a, 132b, 132c, 132d and four terminals 108a, 108b, 108c, 108d. The vertical Hall element 108 can generate a differential output signal 109b, 109d at terminals 108b, 108d that is responsive to an external magnetic field, and which can be referred to as a magnetic signal herein.

For example, Hall sensor 108 is configured to generate the differential output signal (magnetic signal) 109b, 109d at terminals 108b, 108d. The two terminals 108b, 108d of vertical Hall element 108 are coupled to signal switches 116. In an embodiment, terminal 108a is coupled to a first terminal of first signal switch 116a and terminal 108d is coupled to a first terminal of second signal switch 116b.

In some embodiments, the signal switches 116 receive the differential signal (magnetic signal) 109b, 109d and the diagnostic switches 114 receive a diagnostic signal 130a, 130b at the same time.

Second terminals (i.e., outputs) of diagnostic switches 114 and signal switches 116 are coupled together at an input of signal path 120 of a magnetic field sensor, such as signal path 10 of FIG. 1. When the first terminal of diagnostic switches 114 or signal switches 116 is closed (i.e., connected to corresponding second terminal) the respective switch is closed and feeds to signal path 120.

To coordinate the switches 114, 116, signal switches 116 are controlled by a clock signal, $CK_{signal}$ and diagnostic signal switches 114 are controlled by a clock signal, $CK_{diag}$, which can originate in the clocks bus 92 of FIG. 1. In an embodiment, when diagnostic switches 114 are closed and generating the diagnostic signal into signal path 120, signal switches 116 are open. Alternatively, when signal switches 116 are closed and generating a magnetic field signal into the signal path 120, diagnostic switches 114 are open.

Referring again briefly to FIG. 1, an output of signal path 10 (e.g., comparison signal 22a) may then be provided to output module 30 of FIG. 1 and to signal diagnostics module 82 of FIG. 1. In an embodiment, the output of signal path 10 may be a time-multiplexed signal. In some embodiments, the diagnostic switches 114 and signal switches 116 are configured to generate the time-multiplexed signal such that the time-multiplexed signal alternates between the magnetic signal in one time period and the diagnostic signal in another time period. In one embodiment, upon a first power up of the magnetic field sensor 2, the diagnostic signal is generated first and the magnetic signal is generated second in the time-multiplexed signal. Alternatively, the magnetic signal may be generated first and the diagnostic signal may be generated second.

In an embodiment, to verify a biasing or common mode voltage, and also as another test of the resistance of the vertical Hall element 108, the circuit 150 can include a comparison module 118. Comparison module 118 is configured to compare a signal voltage at terminal 108b (via path 109b) of vertical Hall element 108 to a reference high voltage ($REFH_{diag}$) and to a reference low voltage ($REFL_{diag}$) to determine if the voltage at terminal 108b is within a predetermined acceptable range.

Comparison module 118 can include at least two comparators 118a, 118b, coupled to a logic gate 119 (e.g., OR logic gate). First and second comparators 118a, 118b can be coupled to one terminal, e.g., terminal 108b, of Hall sensor 108 to receive signal 109b. In an embodiment, first comparator 118a compares differential output 109b to a reference high voltage (REFHdiag) value and second comparator 118b compares differential output 109b to a reference low voltage (REFL$_{diag}$). Outputs of first and second comparators 118a, 118bb can be combined using logic gate 119. Logic gate 119 is illustrated as an OR gate in FIG. 2, however it should be appreciated that any type of logic gate may be used depending on a particular application. Output of logic gate 119 is then provided to resistance and biasing diagnostics module 80 of FIG. 1, and by passing the signal path 120, to determine if the biasing of circuit 12 is within a predetermined acceptable. In an embodiment, signal switches 116 are in the open position when resistance and biasing diagnostics module 80 verifies a biasing or common mode voltage, or performs a test of the resistance of the vertical Hall element 108.

Figure 3:
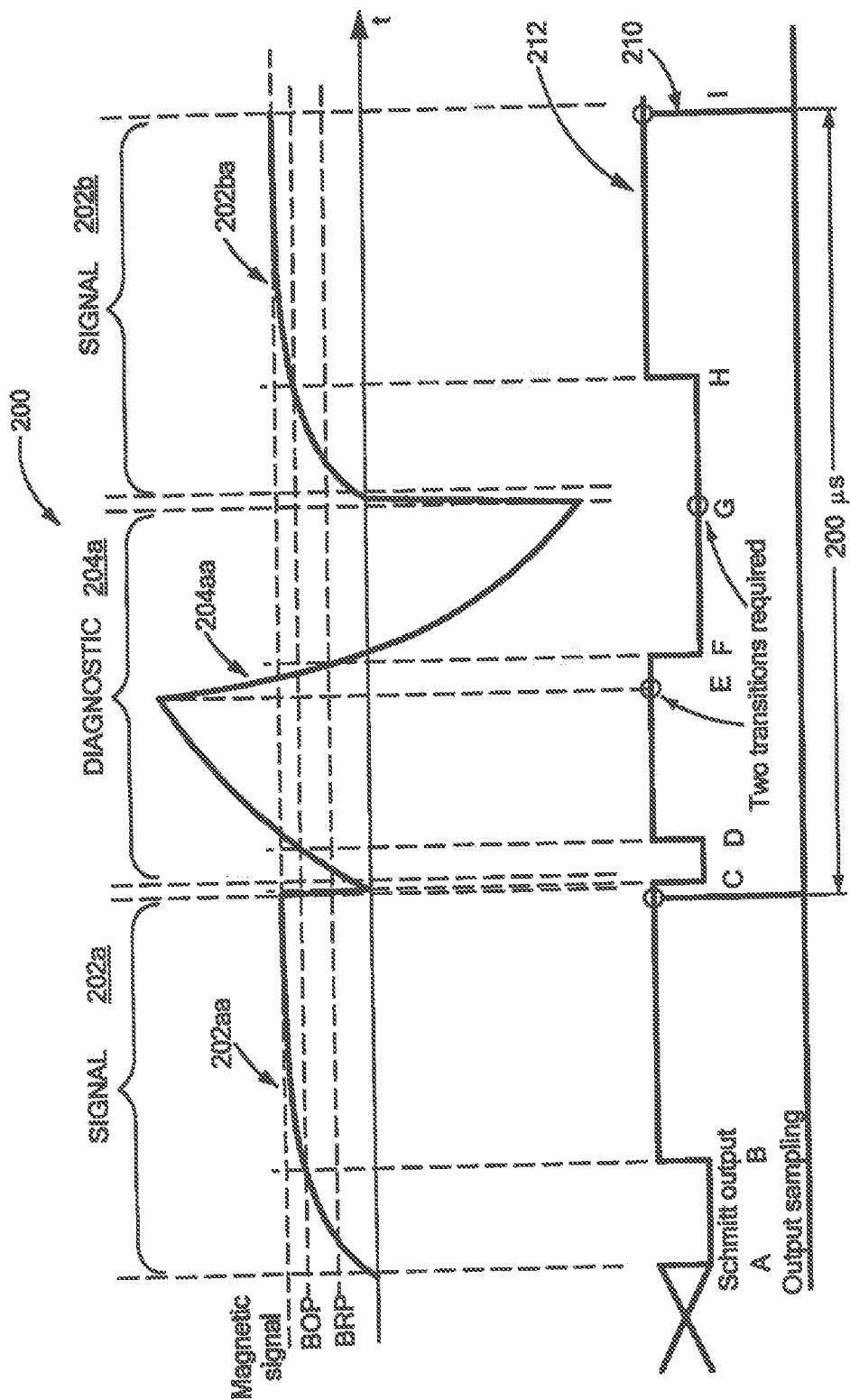
FIG. 3 is graph showing an example of a time multiplexing diagram illustrating the transition between a magnetic signal and a diagnostic signal.

Now referring to FIG. 3, graphs 200, 210 have vertical axes with scales in units of volts in arbitrary units and horizontal axes with scales in units of time in arbitrary units. FIG. 3 illustrates the transition between a magnetic signal (as may be generated by the magnetic signal switches 116 of FIG. 2) and a diagnostic signal (as may be generated by the diagnostic signal switches 114 of FIG. 2). In an embodiment, FIG. 3 illustrates a signaling scheme of magnetic field sensor 2 of FIG. 1. A plurality of time periods may include both a magnetic signal time period 202 and a diagnostic signal time period 204. In one embodiment, each one of the plurality of time periods may be about two hundred microseconds, as shown in FIG. 3. However, it should be appreciated that the time periods may be greater than or less than two hundred microseconds according to a particular application.

In general overview, the signal time periods (e.g., 202a) refers to time periods in which a magnetic signal (e.g., magnetic field signal 116a, 116b of FIG. 2) is applied to signal path 10, resulting in a magnetic signal (e.g., 202aa) at the input of comparator 22 of FIG. 1. The diagnostic signal time periods (e.g., 204a) refers to time periods in which a diagnostic signal (e.g., diagnostic signal 114a, 114b) is applied to signal path 10, resulting in a diagnostic signal 204aa at the input of comparator 22 of FIG. 1.

B$_{OP}$ refers to an operating point threshold of the comparator 22 of FIG. 1. B$_{RP}$ refers to a release point threshold of the comparator 22. Comparator output 212 can be the same as or similar to the comparison signal 22a of comparator 22 of FIG. 1. Letter references (e.g., A-I) are further added to FIG. 3 to aid in describing the signaling scheme.

Magnetic signals 202aa, 202ba and a diagnostic signal 204aa during the time periods 202a, 204a, 202b are indicative of the filtered signal 20a, 20b of FIG. 1.

In the illustrative embodiment, such as during a power on phase indicated at point A, an external magnetic field is initially received by the magnetic field sensor 2 of FIG. 1 and causes the magnetic signal 202aa in the magnetic signal time period 202a to rise. The magnetic field sensor 2 may initially start in a magnetic signal time period 202a or in a diagnostic signal time period 204a. FIG. 3 provides one embodiment, in which a magnetic signal time period (e.g., 202a) occurs first.

As shown in FIG. 3, a comparison signal 212 (e.g., comparison signal 22a of FIG. 1) is initially off and does not turn on until the magnetic signal 202aa in the magnetic signal time period 202a is greater than the operating point threshold, B$_{op}$. Thus, at point B, the magnetic signal 202aa in the magnetic signal time period 202a reaches the operating point threshold, B$_{op}$, and the comparison signal 212 turns on.

Between points B and C, the magnetic signal 202aa in the magnetic signal time period 202a is above the threshold B$_{op}$, and the comparison signal 212 stays on. At point C, a first state of a diagnostic signal (e.g., a square wave diagnostic signal 114a, 114b generated by the switches 114 of FIG. 2 or by the diagnostic current source 112) is applied during the diagnostic time period 204a and passes through the signal path 10 to the comparator 22 of FIG. 1. At a beginning of the diagnostic time period 204a the diagnostic signal 204aa begins below the release point threshold, B$_{RP}$, and turns off comparison signal 212. When the diagnostic signal 114a, 114b (FIG. 1) persists in a first state during the diagnostic time period 204a, the diagnostic signal 204aa transitions above the operating point threshold, Bop, and the comparison signal 212 achieves a high state. When the diagnostic signal 114a, 114b (FIG. 1) transitions to a second different state during the diagnostic time period 204a, the diagnostic signal 204aa transitions below the release point threshold, Brp, and the comparison signal 212 achieves a low state.

Thus, the comparison signal 212 make one or more electronic transitions during the diagnostic signal time period 204a and corresponding correct transitions of the comparison r signal 212 can be indicative of a passing condition of the signal path 10.

In some embodiments, when diagnostic signal 114a, 114b is injected during the diagnostic time period 204a, the magnetic signal 116a, 116b represented in the magnetic signal time period 202a is canceled.

In an embodiment, a time slot may be provided when transitioning between a magnetic signal time period (e.g., 202a) and a diagnostic signal time period (e.g., 204a) to allow for proper signal settling during both signals. The time slot between transitions may be used to prevent inter-slot coupling.

Initially, diagnostics signal 204aa during the diagnostic signal time period 204a is below the operating point threshold, B$_{op}$. Thus, comparator output 212 remains off until diagnostic signal 204aa during the diagnostic signal time period 204a rises above the operating threshold, B$_{op}$, at point D. Unlike, the magnetic signal 202aa during the magnetic signal time period 202a, diagnostic signal 204aa during the diagnostic signal time period 204a is configured to force two transitions (i.e., cause comparator output 212 to turn on and turn off) to verify the output of the circuit path 10 (FIG. 1) in both an ON state and OFF state. In other words, diagnostic signal 204aa during the diagnostic time period 204a is configured to turn comparison signal 212 on and then off in a single one or the diagnostic signal time periods (e.g., 204aa). The channel reset (i.e., two-state transition) between time periods may be used to force transitions and prevent inter-slot coupling.

As illustrated in FIG. 3, diagnostic signal 204aa during the diagnostic signal time period 204a initially rises above the operating point threshold, B$_{OP}$ and then, at point E, begins to fall until at point F it falls below the release point threshold, B$_{RP}$, causing comparison signal 212 to turn off. Diagnostic signal 204aa during the diagnostic signal time period 204a continues to fall until, at point G, the input signal transitions from diagnostic signal 204aa during the diagnostic signal time period 204a to magnetic signal 202ba during the magnetic signal time period 202b.

At point G, a time slot occurs to allow for proper signal settling during the transition. Further, comparison signal 212 remains off until a signal rises above the operating point threshold $B_{OP}$. Magnetic signal 202ba during the magnetic signal time period 202b rises, until at point H, the magnetic signal 202ba is greater than the operating point threshold $B_{OP}$. At point H, comparison signal 212 turns on and remains on while magnetic signal 202ba is greater than the operating point threshold, $B_{OP}$.

Figure 4:
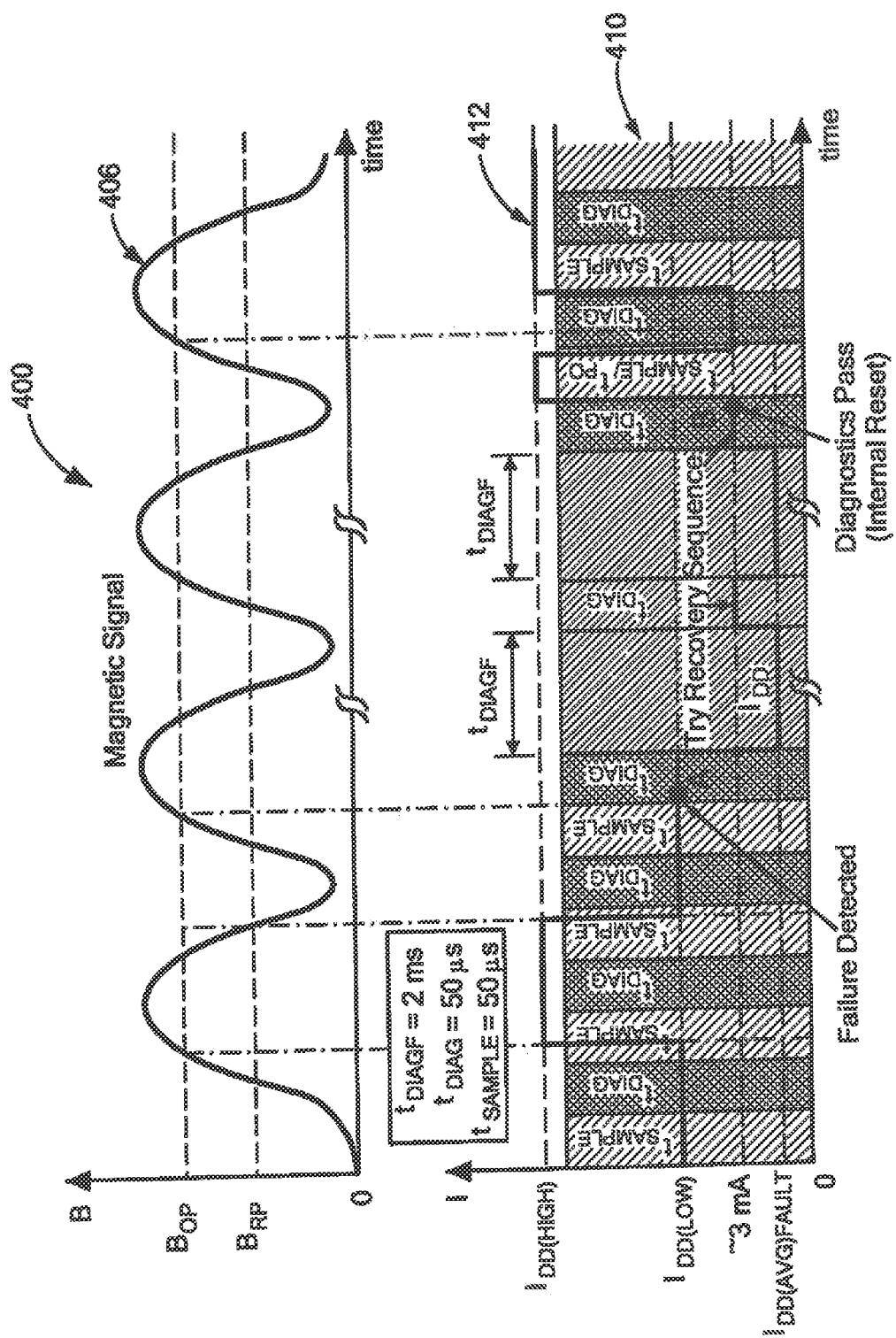
FIG. 4 is a graph showing an example of a recovery signaling scheme for the circuit of FIG. 2 in response to a detected fault.

Referring now to FIG. 4, a graph 400 has a vertical axis with a scale in units of magnetic field in arbitrary units and a horizontal axis with a scale in units of time in arbitrary units. A graph 410 has a vertical axis with a scale in units of volts in arbitrary units and a horizontal axis with a scale in units of time in arbitrary units. FIG. 4 illustrates a signal 412 indicative of a detected fault in the magnetic field sensor 2 of FIG. 1, and indicative of a recovery signaling scheme in response to a detected fault. The signal 412 can be generated by the output driver circuit 34 of FIG. 1.

A digital module may be configured to transition the magnetic field sensor between at least one of: a normal mode, a fault mode, and a recovery mode (i.e., digital module 60 of FIG. 1 by way of the clocks bus 92). For example, digital module may be configured to transition the magnetic field sensor to a FAULT mode in response to a fault detection made by one or more of the above-described four diagnostic modules. In some embodiments, the digital module may be configured to transition the magnetic field sensor to recovery mode in response to a fault detection. The digital module may be configured to provide a recovery sequence signal to the switching network (i.e., diagnostic switches 114 and signal switches 116 of FIG. 2) during recovery mode and the digital module may be configured to transition the magnetic field sensor to normal mode in response to a pass detection, the pass detection received responsive to the recovery sequence signal.

In general overview, $I_{DD(high)}$ is a high level output current (e.g., at a drain terminal of the output diver 34 of FIG. 1), $I_{DD\ (low)}$ is a low level output current (at drain terminal), $I_{DD(AVG)FAULT}$ is a still lower output current during a safe mode (i.e., during a fault condition). Letter references (e.g., A, B are further added to FIG. 4 to aid in describing the signaling scheme. A signal 406 is indicative of a magnetic signal experienced by the magnetic field sensor 2 of FIG. 1.

Initially, upon a power-on phase, the magnetic signal 406 achieves a magnetic field such that the filtered signal 20a, 20b of FIG. 1 less than the operating point threshold, $B_{OP}$, thus, the output signal 412 generated by the output driver circuit 34 is off (e.g., at $I_{DD(low)}$). When magnetic signal 406 achieves a magnetic field such that the filtered signal 20a, 20b is greater than the operating point threshold, $B_{OP}$, the output signal 412 turns on and goes high to $I_{DD(high)}$. The output signal 412 stays high until magnetic signal 406 achieves a magnetic field such that the filtered signal 20a, 20b falls below the release point threshold, at which time the output signal turns off and goes to $I_{DD(low)}$.

At point A, magnetic signal 406 achieves a magnetic field such that the filtered signal 20a, 20b rises above operating point threshold, $B_{OP}$, and the output signal 412 should turn on and rise to $I_{DD(high)}$. However, in this illustrative embodiment, instead, the output signal 412 remains off (e.g., at $I_{DD(low)}$). This indicates a fault condition and in response, the circuit goes into a recovery sequence as a new diagnostic signal time period is generated after point A.

The magnetic field sensor 2 may initiate a first recovery sequence to clear the fault condition. For example, a processing unit may be configured to transition the magnetic field sensor 2 to recovery mode in response to a fault detection and a diagnostic current source (e.g., 106a, 106b of FIG. 2) may be configured to provide a recovery sequence.

In an embodiment, the recovery sequence includes a first diagnostic signal time period, followed by waiting time period, followed by another diagnostic signal time period spanning points A and B. Magnetic signal time periods are suspended between points A and B during a recovery sequence. The recovery sequence continues with diagnostic signal time periods followed by wait time periods until the respective circuit or component of the magnetic field sensor passes the diagnostic test. In other embodiments, the recovery sequence may continue for a predetermined number of attempts.

If the circuit passes the recovery sequence, the magnetic field sensor 2 may perform a system reset, for example, at point B. In some embodiments, a processing unit of the magnetic field sensor 2 is configured to thereafter transition the magnetic field sensor 2 to normal mode (in which magnetic signal time periods and diagnostic signal time periods continue in the above described time-multiplexed arrangement) in response to a pass detection, whereby the pass detection is received responsive to the recovery sequence signal. For example, at point B, a diagnostic pass is indicated and the circuit forces the output signal 412 high for a time period to verify the fault has been cleared and the circuit is working in both the OFF state and ON state. Output signal 412 is forced high despite magnetic signal 406 being less than operating point threshold $B_{OP}$.

Once a time period has passed, the output signal 412 turns off and drops to $I_{DD(low)}$ to re-align with magnetic signal 406. In an embodiment, the output signal 412 re-aligns with magnetic signal 406 during the next magnetic signal time period (i.e., after a diagnostic time period).

Figure 5:
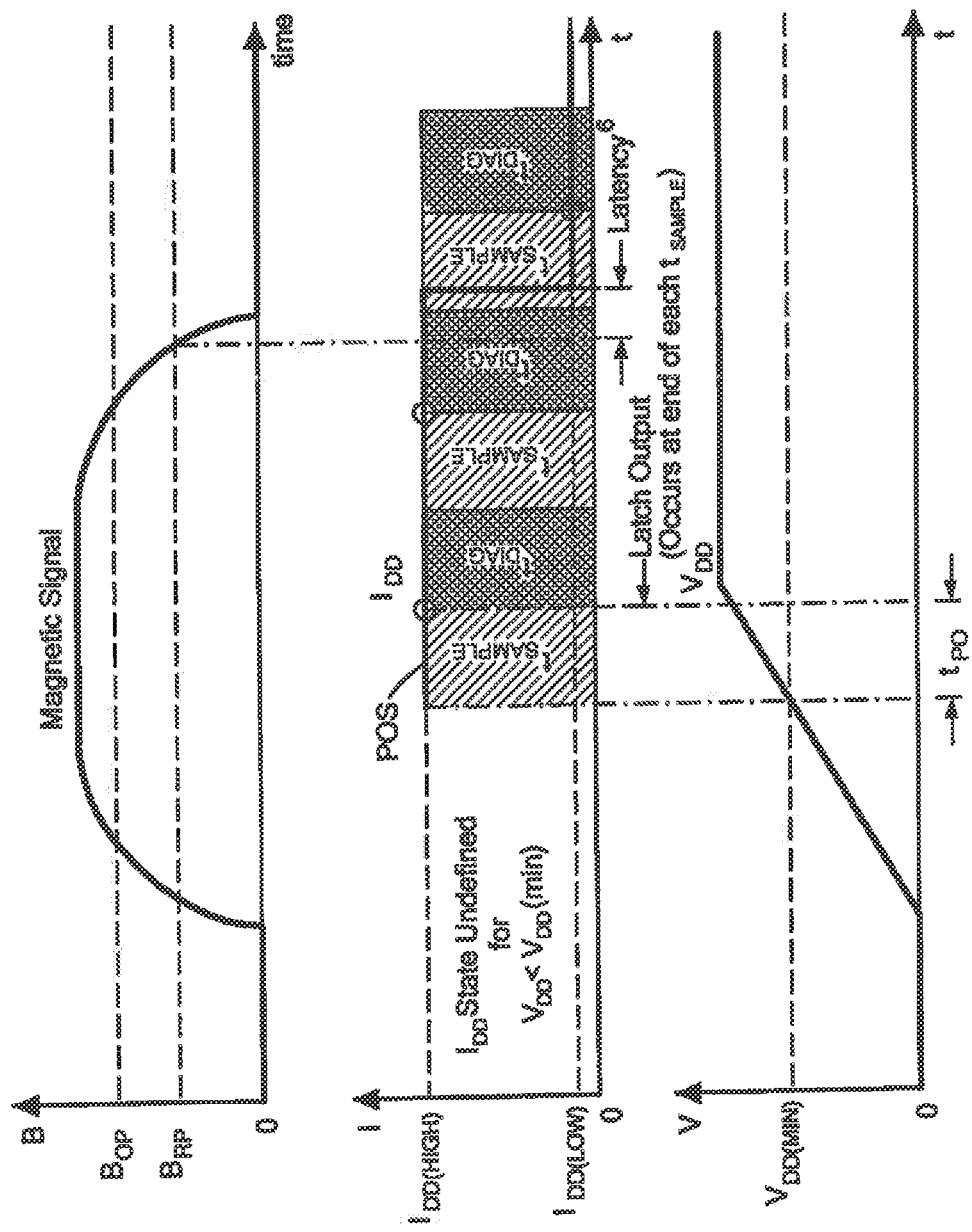
FIG. 5 is a graph showing an example of a signaling scheme during a power-on phase initiated with a magnetic signal.
Figure 6:
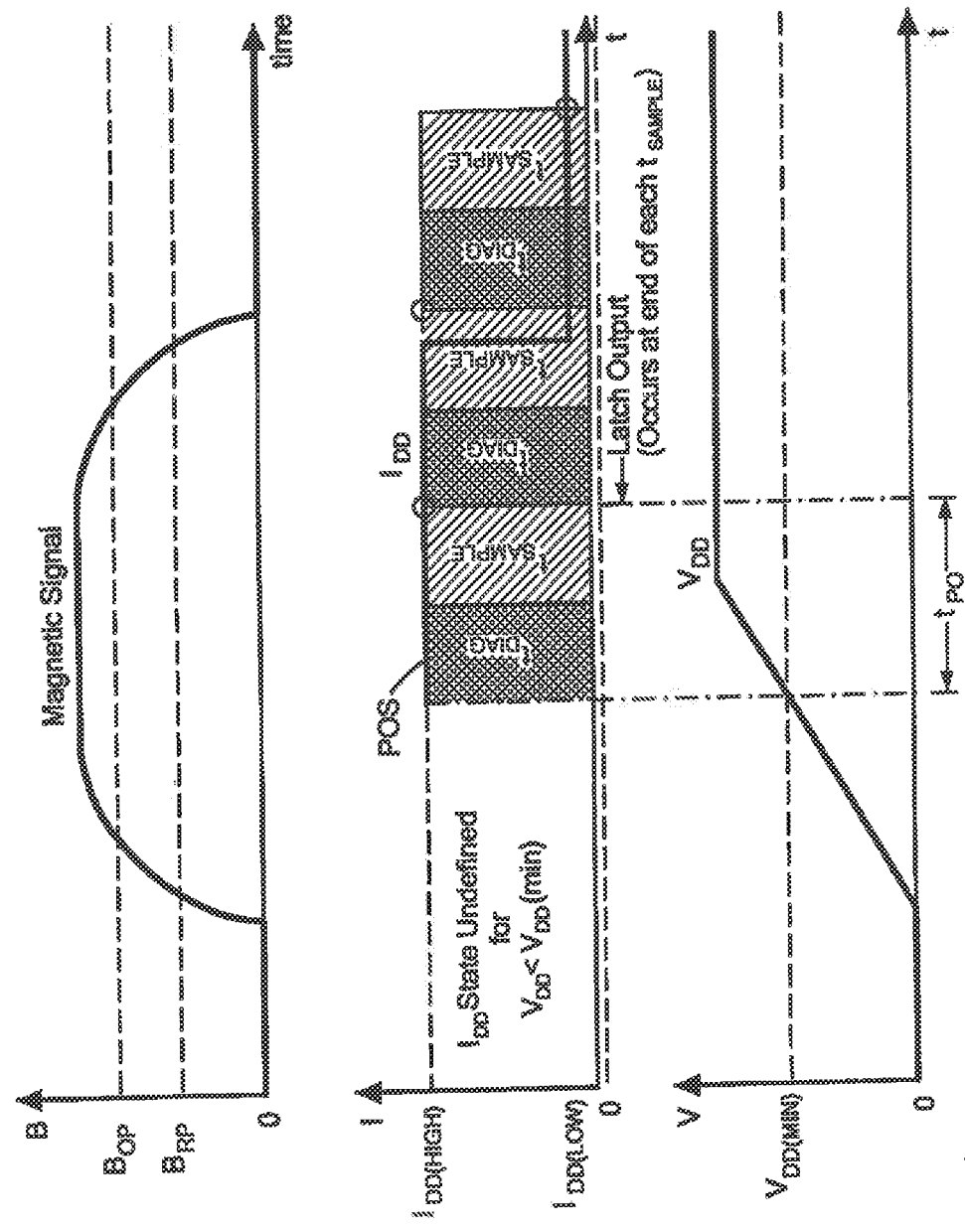
FIG. 6 is a graph showing a signaling scheme during a power-on phase initiated with a diagnostic signal.

Now referring to FIGS. 5-6, during a power-on phase, the magnetic field sensor 2 may start initially with a magnetic signal time period (FIG. 5) or may initially start with a diagnostic signal time period (FIG. 6). For example, in FIG. 5, when the circuit is powered up, the first signal applied is a magnetic signal. The output current $I_{DD}$ may be undefined until the output voltage, $V_{DD}$ reaches a voltage output minimum, $V_{DDMIN}$. Once the output voltage ($V_{DD}$) reaches the minimum, the first magnetic sample may be applied followed by a diagnostic sample.

Alternatively, in FIG. 6, the first signal applied is a diagnostic signal. In an embodiment, FIG. 6 may be similar to FIG. 5 except that diagnostics are run initially during power-on instead of after a magnetic sample has run as in FIG. 5. Thus, before running the first magnetic sample in a sampling cycle, an installment of a diagnostics sample is run.

In an embodiment, whether the first time period is a magnetic signal time period or a diagnostic signal time period, the latch output will be measured from at the end of each a first magnetic signal time period ($t_{sample}$.) For example, in FIG. 5, the first latch output is taken at the end of the first magnetic signal time period and prior to a diagnostic sample time period. However, in FIG. 6, the first latch output is taken after a diagnostic sample and also after a first magnetic signal time period. The decision between whether to run a magnetic signal time period or a diagnostic signal time period first may vary depending on the needs of a particular application.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A magnetic field sensor comprising:
   a magnetic field sensing element directly coupled to a sensor biasing current source at a first terminal of the magnetic field sensing element;
   a switching network coupled to the magnetic field sensing element, the switching network comprising a plurality of diagnostic switches and plurality signal switches,
   wherein a first diagnostic switch of the plurality of diagnostic switches is directly coupled to a diagnostic input current source and to a first terminal of a diagnostic resistive element and a second diagnostic switch of the plurality of diagnostic switches is directly coupled to a second terminal of the magnetic field sensing element and to a second terminal of the diagnostic resistive element,
   wherein the plurality of signal switches are each directly coupled to a corresponding terminal of the magnetic field sensing element that is not the first or second terminals, and
   wherein the switching network is configured to generate a time-multiplexed signal comprising a magnetic signal responsive to an external magnetic field in a magnetic signal time period and a diagnostic signal responsive to the diagnostic input current source in a diagnostic signal time period, and wherein the diagnostic signal is operable to force an intermediate signal to produce a predetermined sequence.

2. The magnetic field sensor of claim 1, wherein the predetermined sequence is a transition between a first state and a second state.

3. The magnetic field sensor of claim 1, wherein the switching network is configured to generate the time-multiplexed signal such that the time-multiplexed signal alternates between the magnetic signal and the diagnostic signal.

4. The magnetic field sensor of claim 3, wherein the diagnostic signal is generated first and the magnetic signal is generated second in the time-multiplexed signal.

5. The magnetic field sensor of claim 3, wherein the magnetic signal is generated first and diagnostic signal is generated second in the time-multiplexed signal.

6. The magnetic field sensor of claim 1, wherein the magnetic field sensing element is coupled to the plurality of signal switches of the switching network and the magnetic signal is provided to the plurality of signal switches.

7. The magnetic field sensor of claim 1, wherein the switching network is configured to receive the sensor biasing current source and the diagnostic input current source simultaneously.

8. The magnetic field sensor of claim 2, further comprising a comparator coupled to the switching network, wherein the comparator is configured to receive the time-multiplexed signal and output an output signal in the first state or the second state responsive to the magnetic signal and the diagnostic signal.

9. The magnetic field sensor of claim 1, further comprising a fault monitoring module comprising:
   a signal module;
   a resistance module;
   an oscillator module; and
   a memory module.

10. The magnetic field sensor of claim 9, wherein the signal module is configured to compare a reference diagnostic signal to the diagnostic signal in the diagnostic signal time period to verify a quality of the diagnostic input current source.

11. The magnetic field sensor of claim 9, wherein the magnetic field sensing element further comprises a resistance element, and wherein the resistance module is configured to compare a resistance value of the resistance element to a predetermined range of values.

12. The magnetic field sensor of claim 9, wherein the oscillator module is configured to monitor an output of a clock logic module, the clock logic module configured to generate logic signals for the switching network.

13. The magnetic field sensor of claim 9, wherein the memory module is configured to monitor a memory value for the magnetic field sensor.

14. The magnetic field sensor of claim 9, wherein each of the signal module, the resistance module, the oscillator module and the memory module is configured to detect a parametric shift from an initial set of values for the magnetic field sensor to a second set of values, wherein the second set of values is outside a predetermined acceptable limit.

15. The magnetic field sensor of claim 9, further comprising a processing circuit coupled to the fault detection module, wherein the processing circuit is configured to receive a fault detection from each of the signal module, the resistance module, the oscillator module and the memory module.

16. The magnetic field sensor of claim 15, wherein the processing unit is configured to transition the magnetic field sensor between each of a normal mode, a fault mode, and a recovery mode, wherein the normal mode indicates the magnetic field sensor is operating within an acceptable range, the fault mode indicates a fault condition within the magnetic field sensor, and the recovery mode indicates a self-test condition within the magnetic field sensor.

17. The magnetic field sensor of claim 16, the processing unit is configured to transition the magnetic field sensor to the fault mode in response to a fault detection from at least one of: the signal module, the resistance module, the oscillator module, and the memory module.

18. The magnetic field sensor of claim 16, wherein the processing unit is configured to transition the magnetic field sensor to recovery mode in response to a fault detection from at least one of the signal module, the resistance module, the oscillator module, and the memory module.

19. The magnetic field sensor of claim 18, wherein the diagnostic input current source is configured to provide a recovery sequence signal to the switching network during recovery mode.

20. The magnetic field sensor of claim 19, wherein the processing unit is configured to transition the magnetic field sensor to the normal mode in response to a pass detection, the pass detection received responsive to the recovery sequence signal.

21. A method for internally performing self-diagnostic testing for a magnetic field sensor, the method comprising:
   providing a sensor biasing current source to a first terminal of a magnetic field sensing element;
   providing a diagnostic input current source to a switching network, the switching network comprising a plurality of diagnostic switches and a plurality of signal switches, wherein the diagnostic input current source is directly coupled to a first diagnostic switch of the plurality of diagnostic switches and to a first terminal of a diagnostic resistive element and a second diagnostic switch of the plurality of diagnostic switches is directly coupled to a second terminal of the magnetic field sensing element and to a second terminal of the diagnostic resistive element, wherein the plurality of signal switches are each directly coupled to a corresponding terminal of the magnetic field sensing element that is not the first or second terminals;

generating a time-multiplexed signal comprising a magnetic signal responsive to an external magnetic field in a magnetic signal time period and a diagnostic signal responsive to the diagnostic input current source in a diagnostic signal time period, wherein the time-multiplexed signal is generated by the switching network; and forcing an intermediate signal to produce a predetermined sequence responsive to the diagnostic signal of the time-multiplexed signal.

22. The method of claim 21, wherein the predetermined sequence is a transition between a first state and a second state.

23. The method of claim 21, further comprising generating the time-multiplexed signal such that the time-multiplexed signal alternates between the magnetic signal and the diagnostic signal.

24. The method of claim 23, further comprising generating the diagnostic signal first and generating the magnetic signal second in the time-multiplexed signal.

25. The method of claim 23, further comprising generating the magnetic signal first and generating the diagnostic signal second in the time-multiplexed signal.

26. The method of claim 21, further comprising providing the time-multiplexed signal to the plurality of signal switches of the switching network.

27. The method of claim 21, further comprising receiving, by the switching network, the sensor biasing current source and the diagnostic input current source simultaneously.

28. The method of claim 22, further generating, by a comparator coupled to the switching network, an output signal in the first state or the second state responsive to the magnetic signal and the diagnostic signal of the time-multiplexed signal.

29. The method of claim 21, further comprising comparing, by a signal module, a reference diagnostic signal to the diagnostic signal to verify a quality of the diagnostic input current source.

30. The method of claim 21, further comprising comparing, by a resistance module, a resistance value of a resistance element of the magnetic field sensing element to a predetermined range of values.

31. The method of claim 21, further comprising monitoring, by an oscillator module, an output of a clock logic module, the clock logic module configured to generate logic signals for the switching network.

32. The method of claim 21, further comprising monitoring, by a memory module, a memory value for the magnetic field sensor.

33. The method of claim 21 further comprising detecting, by each of the signal module, the resistance module, the oscillator module and the memory module, a parametric shift from an initial set of values for the magnetic field sensor to a second set of values, wherein the second set of values is outside a predetermined acceptable limit.

34. The method of claim 21, further comprising receiving, by a processing circuit of the magnetic field sensor, a fault detection from at least one of: the signal module, the resistance module, the oscillator module, and the memory module.

35. The method of claim 34, further comprising transitioning, by the processing unit, the magnetic field sensor between each of a normal mode, a fault mode, and a recovery mode, wherein the normal mode indicates the magnetic field sensor is operating within an acceptable range, the fault mode indicates a fault condition within the magnetic field sensor, and the recovery mode indicates a self-test condition within the magnetic field sensor.

36. The method of claim 35, further comprising transitioning the magnetic field sensor to the fault mode in response to a fault detection from at least one of: the signal module, the resistance module, the oscillator module, and the memory module.

37. The method of claim 35, further comprising transitioning the magnetic field sensor to the recovery mode in response to a fault detection from at least one of: the signal module, the resistance module, the oscillator module, and the memory module, wherein an input voltage to the magnetic field sensing element is modified to a predetermined level.

38. The method of claim 37, further comprising:
generating a recovery sequence signal to test the magnetic field sensor;
providing the recovery signal sequence to the magnetic field sensing element; and
detecting a response of the magnetic field sensor to the recovery signal sequence.

39. The method of claim 38, further comprising:
receiving, by a processing circuit, the response of the magnetic field sensor to the recovery signal sequence,
determining, by the processing circuit, that the magnetic field sensor passed a diagnostic test responsive to the recovery signal sequence; and
generating, by the processing circuit, an internal reset signal.

40. The method of claim 39, further comprising transitioning the magnetic field sensor to the normal mode in response to the internal reset signal.

* * * * *

UNITED STATES PATENT AND TRADEMARK OFFICE
CERTIFICATE OF CORRECTION

| | |
|---|---|
| PATENT NO. | : 10,527,703 B2 |
| APPLICATION NO. | : 14/970949 |
| DATED | : January 7, 2020 |
| INVENTOR(S) | : Gerardo A. Monreal et al. |

Page 1 of 1

It is certified that error appears in the above-identified patent and that said Letters Patent is hereby corrected as shown below:

In the Specification

Column 8, Line 36-37 delete "can" and replace with --can be--.

Column 10, Line 49 delete "an embodiments" and replace with --embodiments--.

Column 11, Line 53 delete "is" and replace with --it--.

Column 11, Line 56 delete "an" and replace with --and--.

Column 13, Line 7 delete "118bb" and replace with --118b--.

Column 13, Line 13-14 delete "a prede-termined acceptable." and replace with --a prede-termined acceptable range.--.

Column 14, Line 17 delete "Bop" and replace with --$B_{OP}$--.

Column 14, Line 22 delete "Brp" and replace with --$B_{RP}$--.

Column 14, Line 51 delete "one or the" and replace with --one or more--.

Signed and Sealed this
Eighth Day of September, 2020

Andrei Iancu
*Director of the United States Patent and Trademark Office*